(12) United States Patent
Nakano et al.

(10) Patent No.: US 6,208,795 B1
(45) Date of Patent: Mar. 27, 2001

(54) OPTICAL WAVEGUIDE ISOLATOR

(75) Inventors: Yoshiaki Nakano; Mitsuru Takenaka, both of Tokyo (JP)

(73) Assignee: Sugimura International Patent & Trademark Agency Bureau, Tokyo (JP)

(*) Notice: Subject to any disclaimer, the term of this patent is extended or adjusted under 35 U.S.C. 154(b) by 0 days.

(21) Appl. No.: 09/527,022

(22) Filed: Mar. 16, 2000

(30) Foreign Application Priority Data

Mar. 19, 1999 (JP) .................................................. 11-075746

(51) Int. Cl.[7] ...................................................... G02B 6/10

(52) U.S. Cl. .............................................. 385/131; 257/11

(58) Field of Search ............................... 257/11, 248, 436, 257/423 P; 385/14, 130, 131, 38, 141, 15, 45; 250/234

(56) References Cited

U.S. PATENT DOCUMENTS

| | | | |
|---|---|---|---|
| 4,978,188 | * 12/1990 | Kawachi et al. | 385/130 |
| 5,463,705 | * 10/1995 | Clauberg et al. | 385/14 |
| 5,747,862 | * 5/1998 | Kishino et al. | 257/436 |
| 6,132,524 | * 10/2000 | Akinaga et al. | 148/300 |

FOREIGN PATENT DOCUMENTS 7-104227    4/1995  (JP) .

* cited by examiner

*Primary Examiner*—Akm E. Ullah
(74) *Attorney, Agent, or Firm*—Venable; Marina V. Schneller

(57) ABSTRACT

An optical waveguide isolator for use in an optical communication system is disclosed. The optical waveguide isolator comprises a semiconductive light amplifier structure including a semiconductor substrate of first conductivity type having a surface of a layer to be formed thereon, a first cladding layer of first conductivity type formed on the substrate, an active layer formed on the first cladding layer, a second cladding layer of the second conductivity type opposite to first conductivity type, formed on active layer, a first electrode formed on the surface of the semiconductor substrate opposite to the surface to be formed as a layer, and a second electrode formed on the second cladding layer; the first and the second cladding layers and the active layer form an optical waveguide in which the light wave propagates. The semiconductive light amplifier structure further comprises a light absorptive magnetic material layer having light absorption function for the light wave propagating through the optical waveguide. The magnetic material layer is magnetized so as to have the magnetic-field component in the direction which corresponds to the direction where a magnetic vector of the light wave vibrates, the waveguide structure body has a nonreciprocity optical characteristic that effective refractive index changes into the light wave to which the optical waveguide is propagated according to the magnet-optical effect of the light absorptive magnetic material layer according to the direction of propagation, by the effective refractive index change in the nonreciprocity, the attenuation of the first light wave that the optical waveguide is propagated in the first direction caused when the said waveguide is propagated, becomes small more than the attenuation of the second light wave propagated in the second direction opposite to the first direction caused when the said waveguide is propagated.

11 Claims, 1 Drawing Sheet

OPTICAL WAVEGUIDE ISOLATOR

BACKGROUND OF THE INVENTION

1. Field of the Invention

The present invention relates to an optical isolator, especially an optical wave guide capable of being integrated on a substrate together with a semiconductor laser and an optical wave guide.

2. Related Art Statement

In the optical communication system, an optical isolator is used to prevent reflected light and scattered light in the end face of the optical fiber from returning to a light source side. An optical isolator using a rotation of polarization plane according to the optical-magnet material, has been put to practical use as an optical isolator now. For example, the optical isolator of Farady rotation type is constituted by a polarizer, a Faraday rotator of optically transparent material and an analyzer, so that polarized components corresponding to the plane of polarization of polarizer out of advanced circular polarization of light to the forward direction, pass through the polarizer, the plane of polarization rotates by Faraday rotator by 45°, and emanate by passing the analyzer which is inclined at the polarizer by 45°. On the other hand, the return light propagated in the direction opposite to the forward direction is obstructed with a polarizer, since after passing the analyzer, the plane of polarization of the return light receives the rotation of 45° by the Faraday rotator and returns to the polarizer. The polarized beam splitter and the double refraction prism are utilized as polarizer and analyzer used by conventional optical waveguide isolator.

The above well known optical waveguide isolator was not able to be manufactured with a semiconductor optical element such as semiconductor lasers and optical modulators as one body, since the well known optical waveguide isolator does not have the semiconductor device structure. Therefore, the well known optical waveguide isolator must be made as another discrete structure with the substrate of the optical circuit to which the semiconductor device such as semiconductor lasers is integrated, so that the manufacturing step becomes complicated and the manufacturing cost becomes expensive, too. Particularly, since the phase matching is necessary, and a precise processing is necessary, so that the manufacturing process becomes complex. On the other hand, if the optical waveguide isolator can be formed on the substrate by using the same semiconductor manufacturing technology as semiconductor devices such as semiconductor lasers and photo diodes, it can manufactured with precise manufacturing step and thus the manufacturing cost can be made cheap greatly.

SUMMARY OF THE INVENTION

It is an object of the present invention to eliminate the above described disadvantages of the conventional.

It is another object of the present invention to provide an optical waveguide isolator capable of integrating it on the semiconductor substrate by using the semiconductor manufacturing technology.

It is another object of the present invention to provide an optical waveguide isolator capable of being manufactured without becoming necessary of phase matching and using complicated manufacturing step.

According to the present invention, there is provided an optical isolator comprising: a semiconductor optical amplifier structure including a semiconductor substrate of first conductivity type having a surface of a layer to be formed thereon, a first cladding layer of first conductivity type formed on the substrate, an active layer formed on the first cladding layer, a second cladding layer of the second conductivity type opposite to first conductivity type, formed on active layer, a first electrode formed on the surface of the semiconductor substrate opposite to the surface to be formed as a layer, and a second electrode formed on the second cladding layer; the first and the second cladding layers and the active layer form an optical waveguide in which the light wave propagates, the semiconductor optical amplifier structure further comprising a light absorptive magnetic material layer having light absorption function for the light wave propagating through the optical waveguide, the magnetic material layer is magnetized so as to have the magnetic-field component in the direction which corresponds to the direction where a magnetic vector of the light wave vibrates, the waveguide structure body has a nonreciprocity optical characteristic that effective refractive index changes into the light wave to which the optical waveguide is propagated according to the magneto-optical effect of the light absorptive magnetic material layer according to the direction of propagation, by the effective refractive index change in the nonreciprocity, the attenuation of the first light wave that the optical waveguide is propagated in the first direction caused when the said waveguide is propagated, becomes small more than the attenuation of the second light wave propagated in the second direction opposite to the first direction caused when the said waveguide is propagated.

The present invention is based on the recognition that the refractive index, that is, the equivalent refractive index of the light wave propagating in the optical waveguide can be changed in the entire waveguide according to the propagating direction of the light wave by using the magnet-optical effect. If the equivalent refractive index can be changed according to the propagating direction of the light wave, the attenuation amount of the light wave propagated to one direction and the attenuation amount of the light wave propagated to the opposite direction can be made different, and thus optical waveguide isolator can be achieved by using the difference of the attenuation amount in case of propagating the light wave in the optical waveguide.

The present invention is based on the above described recognition, to obtain nonreciprocal refractive index change by magnet-optical effect, an optical absorptive magnetic material layer is formed on the optical waveguide, the optical absorptive magnetic material layer is magnetized in the direction corresponding to vibrating direction of a magnetic vector of the light wave propagating the optical waveguide. The light wave propagates the optical absorptive magnetic material layer with the optical waveguide, so that the propagated light wave receives the magnet-optical effect of the optical absorptive magnetic material layer as the entire waveguide structure, and thus not only real part but also imaginary part of refractive index becomes nonreciprocal in the case of the optical absorption magnetic material layer, thereby being capable of making the amount of attenuation different in case of propagating the light wave in the optical waveguide in accordance with the propagating direction. In this case, the amount of the attenuation can differ only by appropriately setting magnetizable direction of the magnetic material layer according to the direction of propagation. As a result, a complicated structure for the phase matching and precise processing step become unnecessary.

Next, the nonreciprocity of the optical waveguide structure according to the present invention is explained theoretically due to the magnet-optical effect thereof. Here, the xyz coordinate system described later and shown in FIG. 1 (the propagating direction of the light wave is assumed to be a z direction and the directions orthogonal to (the propagating direction of the light wave are assumed to be x and y directions) is assumed. In general, the character of the optical-magnet material is shown by the dielectric tensor, and when magnetic material formed on the waveguide is not magnetized, the permittivity $\epsilon$ is shown by the following expression.

$$\varepsilon = \varepsilon_0 \begin{bmatrix} \varepsilon_{xx} & 0 & 0 \\ 0 & \varepsilon_{yy} & 0 \\ 0 & 0 & \varepsilon_{zz} \end{bmatrix} \quad (1)$$

Herein, $\epsilon_0$ shows the permittivity in the vacuum. As is seen from the expression (1), when optical absorption magnetic material is not magnetized, the dielectric tensor has symmetric property, and thus does not exhibit the nonreciprocity of the light wave into which the equivalent refractive index therefore changes according to the propagating direction of the light wave.

On the other hand, when optical absorption magnetic material is magnetized in the y direction, the permittivity $\epsilon$ is shown by the following expression.

$$\varepsilon = \varepsilon_0 \begin{bmatrix} \varepsilon_{xx} & 0 & \varepsilon_{xz} \\ 0 & \varepsilon_{yy} & 0 \\ -\varepsilon_{xz} & 0 & \varepsilon_{zz} \end{bmatrix} \quad (2)$$

As is seen from the expression (1), when the optical absorptive magnetic material layer is magnetized, the dielectric tensor has non-diagonal component, so that The nonreciprocity, into which the effective refractive index changes by the magnet-optical effect according to the existence of the non-diagonal component according to the propagating direction of light wave, is caused.

The changed portion of the equivalent refractive index to the light wave propagated in the transverse magnetic mode in the z direction between the case of magnetizing optical absorption magnetic material and the case of not magnetizing the material in the y direction, can be shown by the following expression.

$$\Delta n + i\Delta k = -\frac{1}{k_0} \frac{\int^{-j\varepsilon_{xz}} \frac{1}{n^4} Hy \frac{dH_y}{dx} dx}{\int \frac{1}{n^2} H_y^2 dx} \quad (3)$$

Herein, $\Delta n + \Delta k$ shows the changed portion of the equivalent refractive index, K0 is a wave number of light in the vacuum, n is refractive index of the each layer of the waveguide, and Hy is a magnetic-field component of the transverse magnetic mode of magnetic material formed on the waveguide.

On the other side, the changed component of the equivalent refractive index to the light wave propagated in $-z$ direction opposite to the z direction, is the same as to residual elements, except that the sign of the term of $\epsilon xz$ of the integration term at the right of the expression (3) only reverses. Therefore, the equivalent refractive index will differ between the traveling wave and the retrograding wave. By positively using the change in the equivalent refractive index of the nonreciprocity due to the magnet-optical effect, the energy attenuation amount according to the energy transfer caused when the light wave propagates the said waveguide, from the optical waveguide to the optical absorptive magnetic material layer, changes according to the direction of propagation, so that the optical waveguide isolator can be achieved. In this case, the incident signal light can be outputted with light amplification by assuming the optical waveguide structure to be a semiconductor optical amplifier structure so as to compensate the attenuation amount of the signal light caused in case of propagating the signal light on the waveguide, so that the isolation function can be achieved without attenuating the signal light.

Next, the isolation ratio is explained. Isolation ratio IR can be shown by the following expressions.

IR=output strength of backward propagating wave/output strength of forward propagating light (4)

By using the expression (2), the isolation ratio can be shown by difference $2\Delta k$ between the attenuation of the forward-propagating wave and the attenuation of the backward propagating wave. this is shown by expression (5).

$$I_R = |\exp(2|\Delta k|k_0 L)|^2 \quad (5)$$

Herein, L is length of the device. It was confirmed to be able to obtain the isolation ratio of 40 dB in the length of the device of about 2.0 mm since the optical waveguide isolator explained by the embodiment described later was simulated.

In a preferable embodiment of the optical waveguide isolator according to the present invention, first light wave is a signal light to be transmitted along a transmission system, and the second light wave is the return light propagated in the direction opposite to the signal light. According to such a construction, the signal light to be transmitted is not so attenuated, and the return light such as reflected light and the scattered light caused in transmission path can be greatly attenuated.

In another embodiment of the optical waveguide isolator according to the present invention, the optical absorption magnetic material layer is constituted by magnetic material magnetized so as to have the magnetic-field component in the direction corresponding to the vibrating direction of a magnetic vector of the first light wave propagating on the waveguide. To obtain the nonreciprocity according to the magnet-optical effect, the direction of the external magnetic field should be made to correspond to the vibrating direction of a magnetic vector of the light wave having various modes propagating on the waveguide, for example, the magnetic material layer is formed in the case of the transverse magnetic mode light along the plane parallel to the substrate, so that the nonreciprocity according to the magnet-optical effect can be achieved by magnetizing the magnetic material layer in a direction orthogonal to the propagating direction of light wave.

As optical absorption magnetic material which causes the magnet-optical effect, ferromagnetic material of nickels, iron, and cobalt, etc. and various magnetic materials such as yttrium iron garnet (YIG) can be used.

According to the suitable embodiment of the optical waveguide isolator of the present invention, this substrate is semiconductor substrate, and the core layer and first and second cladding layer are constituted with semiconductor material. According to such a constitution, the optical waveguide isolator can be formed on the same semiconductor substrate with semiconductor laser by using the semiconductor manufacturing technology.

Another embodiment of the optical waveguide isolator according to the present invention, there is provided an optical waveguide isolator comprising a semiconductive light amplifier structure including a semiconductor substrate of first conductivity type having a surface of a layer to be formed, a first cladding layer of first conductivity type formed on the substrate, an active layer formed on the first cladding layer, a second cladding layer of second conductivity type opposite to first conductivity type, formed on the active layer, a first electrode formed on the surface of the semiconductor substrate opposite to the surface to be formed as a layer, and a second electrode formed on the second cladding layer; the first cladding layer, the active layer, and the second cladding layer constitute an optical waveguide, the second electrode includes a light absorptive magnetic material layer magnetized so as to have a magnetic-field component in the direction corresponding to the vibrating direction of a magnetic vector of the light wave propagating in the waveguide, the optical waveguide and the magnetic material layer of the second electrode constitute an optical waveguide structure, the waveguide structure body has a nonreciprocity optical characteristic that effective refractive index changes into the light wave to which the optical waveguide is propagated according to the magneto-optical effect of the light absorptive magnetic material layer according to the direction of propagation, by the effective refractive index change in the nonreciprocity, the attenuation of the first light wave that the optical waveguide is propagated in the first direction caused when the said waveguide is propagated, becomes small more than the attenuation of the second light wave propagated in the second direction opposite to the first direction caused when the said waveguide is propagated. Thus, if the optical waveguide isolator is constituted as a structure of the semiconductor optical amplifier, the incident signal light can be amplified by adjusting the output voltage in the DC bias source connected between the first electrode and the second electrode and can emanate as a signal light with the same energy level as the energy level at the incident time.

In another embodiment of the optical waveguide isolator having the light amplifier structure, the one electrode of the light amplifier structure has a nickel layer and a gold layer which are magnetized in the direction corresponding to the vibrating direction of a magnetic vector of the first light wave.

In this embodiment, there is an advantage by which the electrode of the light amplifier can be co-used as an optical absorptive magnetic material layer.

DETAILED EXPLANATION OF THE PREFERRED EMBODIMENT

Figure 1:
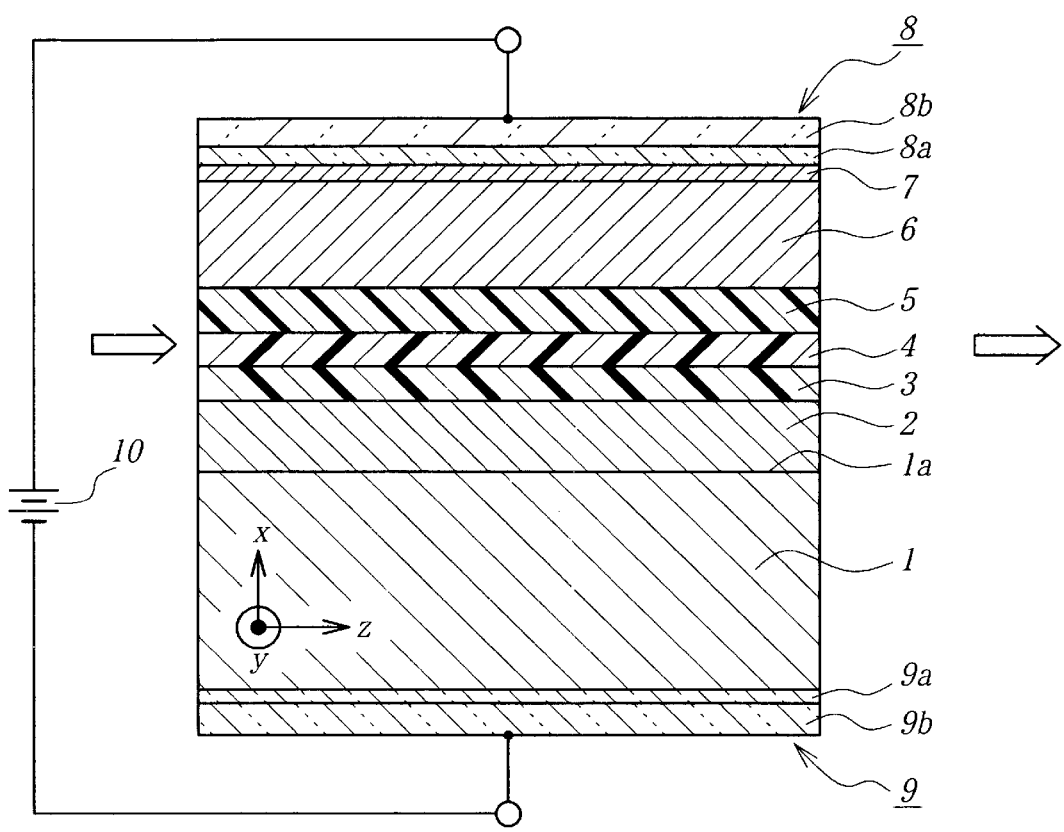
FIG. 1 is a diagrammatic sectional view showing the constitution of one embodiment of optical isolator according to the present invention.

Now to the drawings, there is shown an embodiment of an optical waveguide isolator according to the present invention. FIG. 1 is a diagrammatic cross-sectional view showing the constitution of one embodiment of the optical waveguide isolator according to the present invention. This embodiment explains the optical waveguide isolator having a semiconductor optical amplifier structure for amplifying and emanating incident light. In FIG. 1, assuming that the light wave is propagated to a z direction, and a semiconductor layer structure is formed along an x direction. Substrate 1 of InP of n type is prepared, and the semi-conductor layer structure is formed on a layer forming surface 1a of the substrate.

Substrate 1 has the thickness of 100 $\mu$m, and the high impurity concentration is assumed to be $1\times1018$ atoms/cm$^3$ for example. For example, the sulfur can be used as impurities of n type.

First cladding layer 2 of n type InP is deposited on the substrate 1 of InP. First cladding layer 2 has the thickness of 200 nm and the refractive index of 3.16, and the high impurity concentration is assumed to be $1\times1017$ atoms/cm$^3$. Undoped first guide layer 3 of InGaAsP is formed on the first cladding layer 2. The thickness of first guide layer 3 is, for example, 120 nm, and the refractive index is 3.37. Undoped active layer 4 of InGaAsP is formed on the first guide layer 3. The active layer 4 has a thickness of 100 nm and refractive index of 3.4132. For xample, in this embodiment, the active layer of the monolayer is used, but, a multiple quantum well structure of InGaAs and InGaAsP can be used. Undoped second guide layer 5 of InGaAsP is formed on the active layer 4. Second guide layer 5 has the thickness of 120 nm and refractive index of 3.37.

A second cladding layer 6 of p type InP is deposited on the second guide layer 5. The second cladding layer has a thickness of 300 nm and a refractive index of 3.16, and its impurity concentration is $1\times1017$ atoms/cm$^3$. A cap layer 7 of p type InGaAs is formed on the second cladding layer 6. The cap layer 7 has a thickness of 30 nm, and its impurity concentration is $1\times1019$ atoms/cm$^3$.

First electrode 8 is formed on the cap layer 7. The first electrode 8 is formed by a nickel layer 8a of 50 nm in thickness and a gold layer 8b of 100 nm in thickness formed on the nickel layer 8a. The nickel layer 8a constitutes a first electrode 8 together with the gold layer 8b, and functions as an optical absorption magnetic material layer which exhibits a magneto-optical effect for the light wave propagating waveguide. A second electrode 9 is formed on the other side of substrate 1 opposite to the layer forming surface 1a. The second electrode is formed by a titanium layer 9a of 50 nm in thickness and a gold layer 9b of 100 nm in thickness. A DC bias source 10 is connected between the first electrode 8 and the second electrode 9, so that the incident light wave is amplified to the level more than the energy level thereof and emanated therefrom.

The optical waveguide isolator functions as a semiconductor optical amplifier and functions as a single optical waveguide structure. That is, the active layer 4 and the first and second guide layers 3 and 5 formed on both sides thereof constitute a core layer of the optical waveguide, The first cladding layer 2 constitutes a cladding layer formed on the one side of the optical waveguide, the second cladding layer 6 and cap layer 7 form a cladding layer formed on the other side of the optical waveguide, and the nickel layer 8a constitutes an optical absorption magnetic material layer, so that an optical waveguide is constituted by the core layer and the first and second cladding layer, and an optical absorptive magnetic material layer is constituted by the nickel layer 8a, thereby constituting a single optical waveguide structure. In this case, the waveguide type optical waveguide isolator having the substantially same structure as the semiconductor laser can be integrated on the same semiconductor substrate.

It is necessary that the optical waveguide isolator according to the present invention have an asymmetrical structure to the light wave propagating the waveguide. In the embodiment shown in FIG. 1, it can be considered that the y direction has extended to infinity. On the other hand, the optical absorptive magnetic material layer is formed only on the other side of the substrate about the x direction, so that an asymmetrical structure is secured in the x direction.

The second cladding layer 6 has an important meaning to define the distance between the core layer and the optical absorptive magnetic material layer of the optical waveguide. That is, the thickness of the second cladding layer 6 has an important meaning to define the energy amount which begins to exude on the light absorptive magnetic material layer 8a side of the light wave propagating on the waveguide structure, that is, the amount that the evanescent light of the propagated light wave is infiltrated to the light absorptive magnetic material layer, and to define the strength according to the magnet-optical effect of the propagated light wave to the optical absorptive magnetic material layer. Therefore, the thickness of second cladding layer 6 is appropriately set in consideration of the wave length of the light wave propagating on the waveguide and the usage as the optical waveguide isolator.

Next, the magnetizing direction of the optical absorptive magnetic material layer 8a is explained. The transverse magnetic mode wave propagated in the z direction of FIG. 1(From the left side of space aiming at the right of) is assumed as signal light. In this case, a magnetic vector of the transverse magnetic mode wave vibrates in the y direction. Therefore, magnetic material layer 8a is formed to be extended along the y direction, and magnetized so as to turn from the interior side of space to the frontward side. By magnetizing the optical absorptive magnetic material layer in such a direction, the attenuation to the signal light propagated in the z direction is minimized, the attenuation to the reflected wave and the scattered light propagated in the opposite direction (−the z direction) can be maximized, and thus a large isolation ratio can be obtained. The magnetizing direction of the magnetic material layer need not accurately correspond to the direction of a magnetic vector of the light wave propagating the waveguide, and thus the desired performance can be obtained by only magnetizing the magnetic material layer so as to have a magnetic component of the direction corresponding to the direction of a magnetic vector.

Moreover, the vibrating direction of a magnetic vector of the transverse electric mode wave becomes x direction in FIG. 1, so that in the case of the waveguide propagating the transverse electric mode wave, the optical absorptive magnetic material layer extended in a direction which is almost orthogonal to layer forming surface 1a of substrate 1 is formed on the side of the waveguide structure, the magnet-optical effect of the magnetic material layer can be used by magnetizing the optical absorptive magnetic material layer in the x direction.

Next, operation of the optical waveguide isolator when the isolator shown in FIG. 1 is used as an optical waveguide isolator having light amplification operation, is explained. Assuming that the signal light propagates in +z direction (from the left side to the right side on the plane), and the return light to be attenuated propagates in the opposite z direction. The optical waveguide isolator causes a strong attenuation operation for the return light and has the attenuation operation about the signal light. Therefore, the optical waveguide isolator performs the optical amplification in such a manner that the attenuation level may at least become 0 levels for the incident signal light and emanates the thus amplified light. The optical amplification rate is controlled by adjusting the voltage level of the DC bias source 10. As a result, the energy level of the return light can be greatly attenuated without decreasing the energy level of the signal light to be propagated.

The present invention is not limited to the above described embodiment, and various modifications and changes can be performed. For example, the compound semiconductor materials of the InP system is used in the above described embodiment, but, for example, GaAs system semiconductor material and GaN system semiconductor material can be used. When GaAs system semiconductor material is used, GaAs is used as a material of the core and AlGaAs can be used as a material of the cladding layer. Moreover, when GaN system semiconductor material is used, InGaN is used as a material of the core and GaN can be used as a material of the cladding layer.

What is claimed is:

1. An optical isolator comprising a semiconductive light amplifier structure including a semiconductor substrate of first conductivity type having a surface of a layer to be formed thereon, a first cladding layer of first conductivity type formed on the substrate, an active layer formed on the first cladding layer, a second cladding layer of the second conductivity type opposite to first conductivity type, formed on active layer, a first electrode formed on the surface of the semiconductor substrate opposite to the surface to be formed as a layer, and a second electrode formed on the second cladding layer; the first and the second cladding layers and the active layer form an optical waveguide in which the light wave propagates, the semiconductive light amplifier structure further comprising a light absorptive magnetic material layer having light absorption function for the light wave propagating through the optical waveguide, the magnetic material layer is magnetized so as to have the magnetic-field component in the direction which corresponds to the direction where a magnetic vector of the light wave vibrates, the waveguide structure body has a nonreciprocity optical characteristic that effective refractive index changes into the light wave to which the optical waveguide is propagated according to the magnet-optical effect of the light absorptive magnetic material layer according to the direction of propagation, by the effective refractive index change in the nonreciprocity, the attenuation of the first light wave that the optical waveguide is propagated in the first direction caused when the said waveguide is propagated, becomes small more than the attenuation of the second light wave propagated in the second direction opposite to the first direction caused when the said waveguide is propagated.

2. An optical isolator as claimed in claim 1, wherein the first light wave is a signal light to be transmitted along a transmission system, and the second light wave is the return light propagated in the direction opposite to the signal light.

3. An optical isolator as claimed in claim 2, wherein the signal light is a transverse magnetic mode wave. It was magnetic as the magnetic-field component in the direction which formed the, optical absorptive magnetic material layer in parallel to the layer formation face of a the substrate and corresponded to the direction where a magnetic vector of the signal light vibrated was had.

4. An optical isolator as claimed in claim 2, wherein the signal light is a transverse magnetic mode wave, the light absorption magnetic material layer is formed so as to make the layer forming surface of a the substrate substantially orthogonal, and has the magnetic-field component in the direction corresponding to the direction where a magnetic vector of the signal light is vibrated.

5. An optical isolator as claimed in claim 1, wherein the magnetic material is selected from magnetic material of nickel, iron, cobalt or yttrium iron garnet (YIG).

6. An optical isolator comprising a semiconductive light amplifier structure including a semiconductor substrate of first conductivity type having a surface of a layer to be formed, a first cladding layer of first conductivity type formed on the substrate, an active layer formed on the first cladding layer, a second cladding layer of second conductivity type opposite to first conductivity type, formed on the active layer, a first electrode formed on the surface of the semiconductor substrate opposite to the surface to be formed as a layer, and a second electrode formed on the second cladding layer; the first cladding layer, the active layer, and the second cladding layer constitute an optical waveguide, the second electrode includes a light absorptive magnetic material layer magnetized so as to have a magnetic-field component in the direction corresponding to the vibrating direction of a magnetic vector of the light wave propagating in the waveguide, the optical waveguide and the magnetic material layer of the second electrode constitute an optical waveguide structure, the waveguide structure body has a nonreciprocity optical characteristic that effective refractive index changes into the light wave to which the optical waveguide is propagated according to the magneto-optical effect of the light absorptive magnetic material layer according to the direction of propagation, by the effective refractive index change in the nonreciprocity, the attenuation of the first light wave that the optical waveguide is propagated in the first direction caused when the said waveguide is propagated, becomes small more than the attenuation of the second light wave propagated in the second direction opposite to the first direction caused when the said waveguide is propagated.

7. An optical system as claimed in claim 6, further comprising a DC bias source connected between the first electrode and the second electrode, thereby performing a light amplification so as to compensate an attenuation of the first light wave being caused.

8. An optical wave isolator as claimed in claim 6, wherein the first light wave is signal light to be optical amplification, the optical absorptive magnetic material layer is magnetized so as to have the magnetic-field component in the direction corresponding to the vibrating direction of a magnetic vector of the signal light.

9. An optical waveguide isolator as claimed in claim 6, wherein the second electrode has a nickel layer and a gold layer which are magnetized in the direction corresponding to the vibrating direction of a magnetic vector of the light wave of a the first vibrates.

10. An optical waveguide isolator as claimed in claim 6, wherein the semiconductor substrate is constituted with InP, the first and second cladding layers are constituted with InP, and the active layer is constituted with InGaAsP.

11. An optical waveguide isolator as claimed in claim 10, wherein the first conductivity type is n type, and the second conductivity type is p type.

* * * * *